United States Patent
Chen

(10) Patent No.: US 8,303,051 B2
(45) Date of Patent: Nov. 6, 2012

(54) COMPUTER ENCLOSURE WITH EMI SHIELDING CLIP

(75) Inventor: Yun-Lung Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 350 days.

(21) Appl. No.: 12/759,838

(22) Filed: Apr. 14, 2010

(65) Prior Publication Data

US 2011/0221315 A1 Sep. 15, 2011

(30) Foreign Application Priority Data

Mar. 11, 2010 (CN) .......................... 2010 1 0121766

(51) Int. Cl.
*A47B 81/00* (2006.01)
(52) U.S. Cl. .................... 312/223.2; 312/263; 312/265.5
(58) Field of Classification Search ............... 312/223.2, 312/263, 265.5; 361/816, 818
See application file for complete search history.

(56) References Cited

U.S. PATENT DOCUMENTS

| 4,952,752 | A * | 8/1990 | Roun ............................. 174/366 |
| 5,191,544 | A * | 3/1993 | Benck et al. ................... 361/688 |
| 5,777,854 | A * | 7/1998 | Welch et al. ................... 361/800 |
| 6,654,256 | B2 * | 11/2003 | Gough .......................... 361/816 |
| 6,685,503 | B1 * | 2/2004 | Huang et al. .................. 439/527 |
| 6,751,100 | B2 * | 6/2004 | Chen ............................. 361/725 |
| 6,816,391 | B2 * | 11/2004 | Davis et al. .................... 361/818 |
| 6,837,554 | B2 * | 1/2005 | Yamamoto et al. ......... 312/223.2 |
| 7,031,150 | B2 * | 4/2006 | Chen et al. ............... 361/679.33 |
| 7,041,896 | B2 * | 5/2006 | Okamoto ....................... 174/480 |
| 7,132,609 | B2 * | 11/2006 | Soule et al. .................... 174/369 |
| 7,435,915 | B2 * | 10/2008 | Irie ................................ 174/369 |
| 8,141,963 | B2 * | 3/2012 | Chen et al. .................. 312/223.2 |
| 2007/0153489 | A1 * | 7/2007 | Fan et al. ....................... 361/753 |
| 2011/0192626 | A1 * | 8/2011 | Chen et al. ...................... 174/50 |

* cited by examiner

*Primary Examiner* — Hanh V Tran
(74) *Attorney, Agent, or Firm* — Altis Law Group, Inc.

(57) ABSTRACT

A computer enclosure includes a bottom surface, a sidewall connected to the bottom surface, and a cover. A flange is located on a top edge of the sidewall. A plurality of elastic fingers is formed on the flange. Each of the plurality of elastic fingers includes a free end from which a contact point protrudes. The cover covers the flange. The elastic fingers are elastically pressed by the cover, and the contact point contacts the cover.

14 Claims, 7 Drawing Sheets

COMPUTER ENCLOSURE WITH EMI SHIELDING CLIP

BACKGROUND

1. Technical Field

The present disclosure relates to computer enclosures, and more particularly, to a computer enclosure with electromagnetic interference (EMI) shielding clips.

2. Description of Related Art

Equipped with removable covers, computer enclosures incorporate such electronic components as disk drives and PCI cards normally encased within a metal enclosure. Despite providing an "outer skin" for the computer, the covers are themselves unshielded. The encased electronic components are prone to conductive electromagnetic signal leakage from the covers. Such electromagnetic emissions can significantly impact performance of other electronic components outside the enclosure, and components within the enclosure can be affected by the emissions of the electronic components from outside the enclosure. Thus, shielding components of highly conductive material in a sealed enclosure is necessary.

Referring to FIGS. 1 and 2, a prior art computer enclosure 10 is shown. The computer enclosure 10 includes a bottom surface 11, a pair of parallel sidewalls 13 perpendicular to the bottom surface 11, a front wall 14, and a rear wall 15 parallel to the front wall 14. The front wall 14 and the rear wall 15 are perpendicular to the bottom surface 11, and connected between the pair of sidewalls 13. Top edges of the sidewalls 13, the front wall 14, and the rear wall 15 are bent perpendicular to form a plurality of flanges 151 thereon. A plurality of U-shaped slots 156 is defined in the flanges 151. Each slot 156 has an elastic finger 20 formed therein. The elastic finger 20 has a free end. A contact point 21 is formed on the free end for contacting a cover (not shown) when the cover is mounted on the computer enclosure 10. In a commonly used configuration, in computer enclosure 10, the elastic finger 20 is a strip that is not bent. However, the strip is easily deformed with use.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
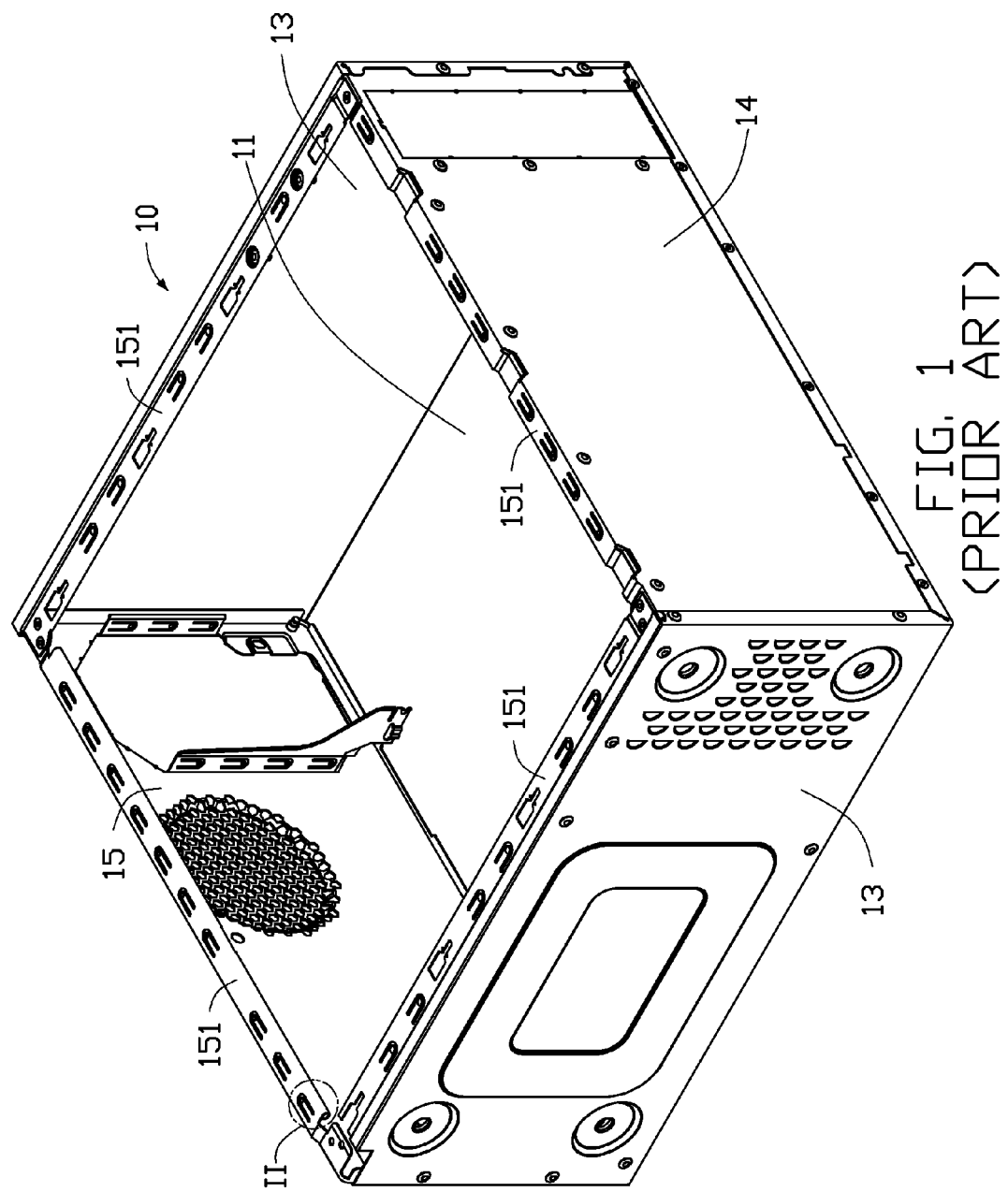
FIG. 1 is an exploded view of a computer enclosure of prior art.
Figure 2:
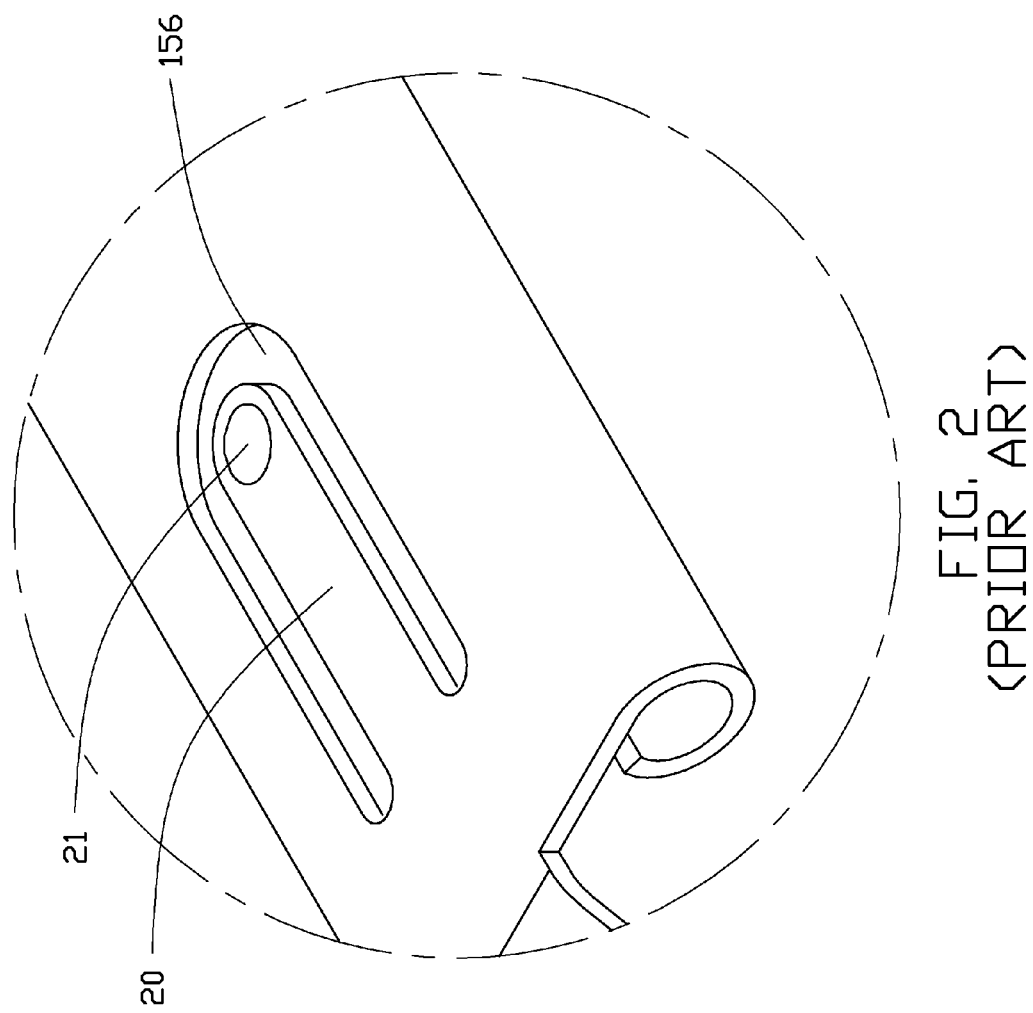
FIG. 2 is an enlarged view of a circled portion II of FIG. 1.
Figure 3:
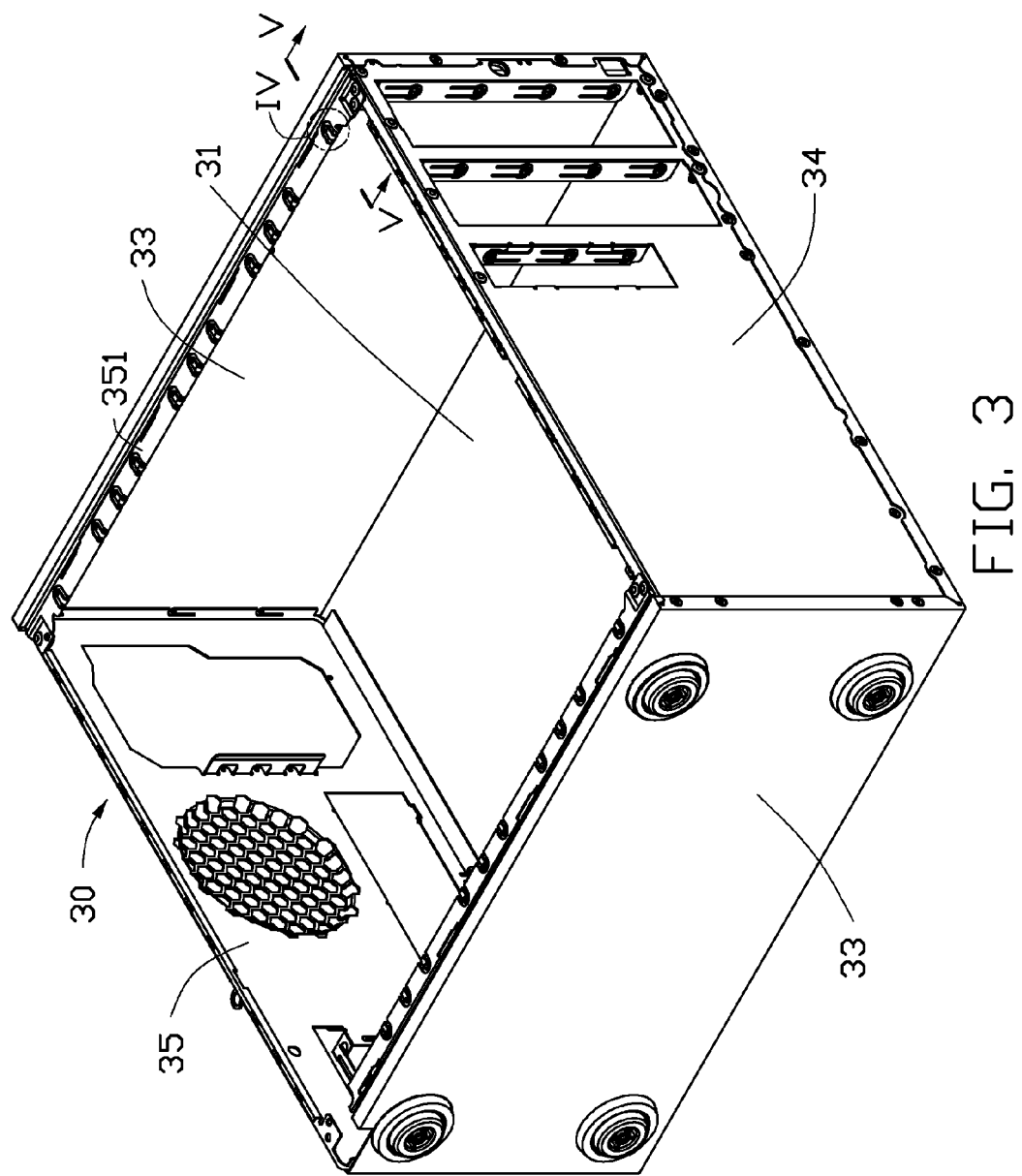
FIG. 3 is an exploded view of a computer enclosure in accordance with an embodiment of the present disclosure.
Figure 4:
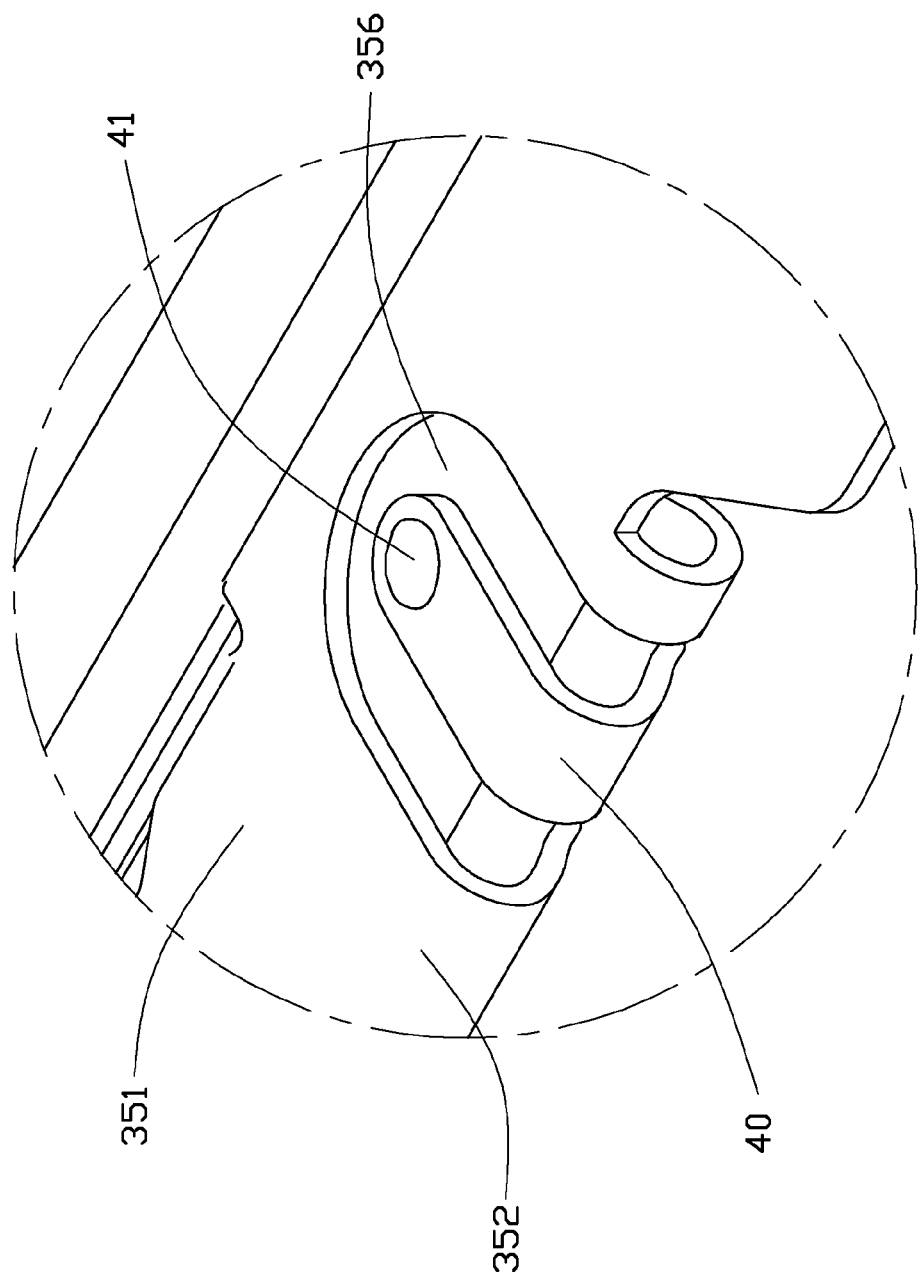
FIG. 4 is an enlarged view of a circled portion IV of FIG. 1.
Figure 5:
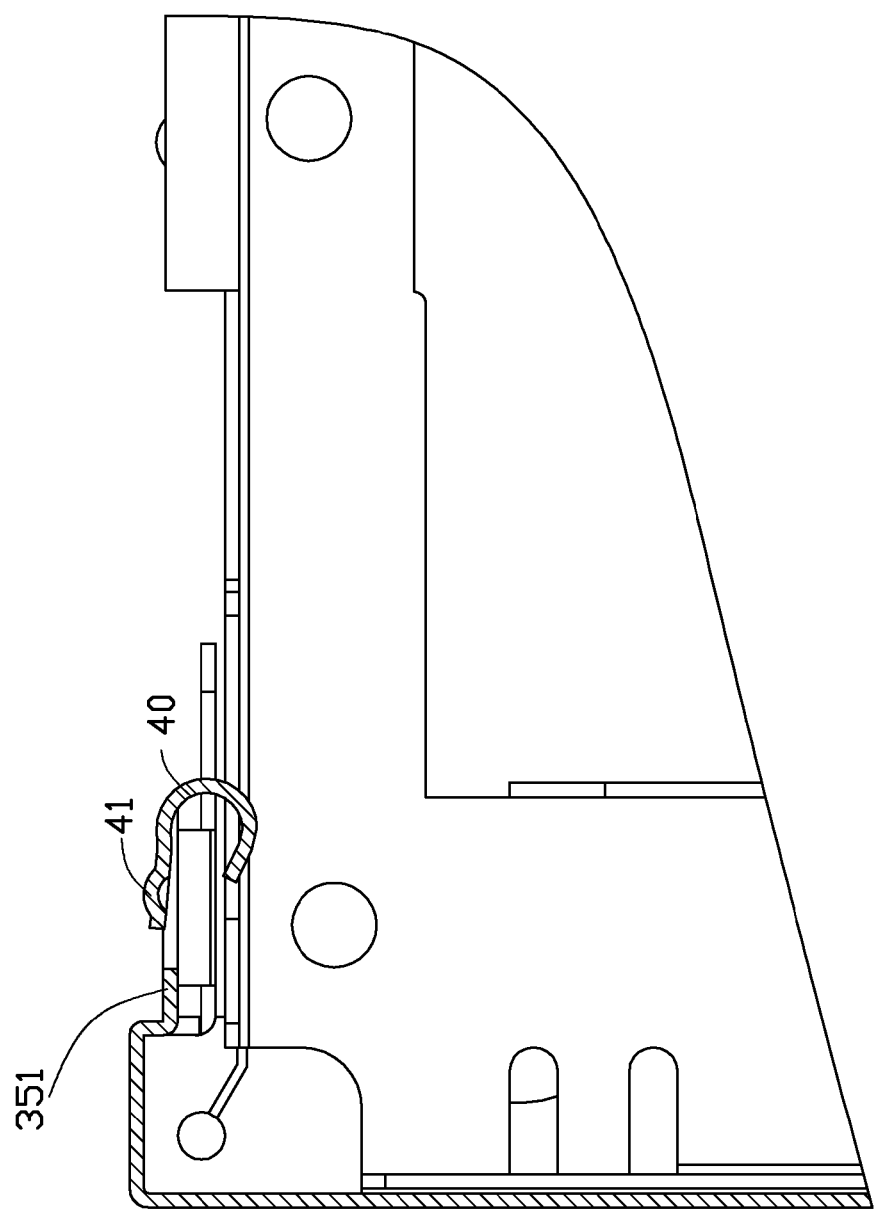
FIG. 5 is a partial cross section taken along line V-V of FIG. 3.

Referring to FIGS. 3 to 5, a computer enclosure 30 in accordance with an embodiment of the present disclosure includes a bottom surface 31, a pair of parallel sidewalls 33 perpendicular to the bottom surface 31, a front wall 34, a rear wall 35 parallel to the front wall 34, and a cover 36 (see FIG. 5). The front wall 34 and the rear wall 35 are perpendicular to the bottom surface 11, and connected between the pair of sidewalls 13. An opening is surrounded by the sidewalls 33, the front wall 34, and the rear wall 35. The cover 36 covers the opening.

Top edges of the sidewalls 33, the front wall 34, and the rear wall 35 are bent substantially perpendicular to form a plurality of flanges 351 thereon. A long edge of each flange 351 is bent downwards to form an edge roll 352 thereof. A plurality of U-shaped slots 356 is defined in the flanges 351. Each of the slots 356 extends to the corresponding edge roll 352. Thus, a substantially "J"-shaped elastic finger 40 is formed in each slot 356, and the slot 356 surrounds three sides of the finger 40. The finger 40 includes a fixed end secured on the corresponding edge roll 352, and a free end that is located in the slot 356. A portion of the finger 40, on which the free end is formed, extends in a direction that intersects an extending direction of the long edge of the flange 351. The free end of the finger 40 is set at an angle in respect to a plane defined by the corresponding flange 351. A contact point 41 protrudes on the free end of the elastic finger 40. In one embodiment, a width of the slot 356 is 2 mm to 3.5 mm, and a width of the finger 40 is 3 mm to 4 mm. In one embodiment, a width of the slot 356 is 2.5 mm and width of the finger 40 is 3.2 mm.

Figure 6:
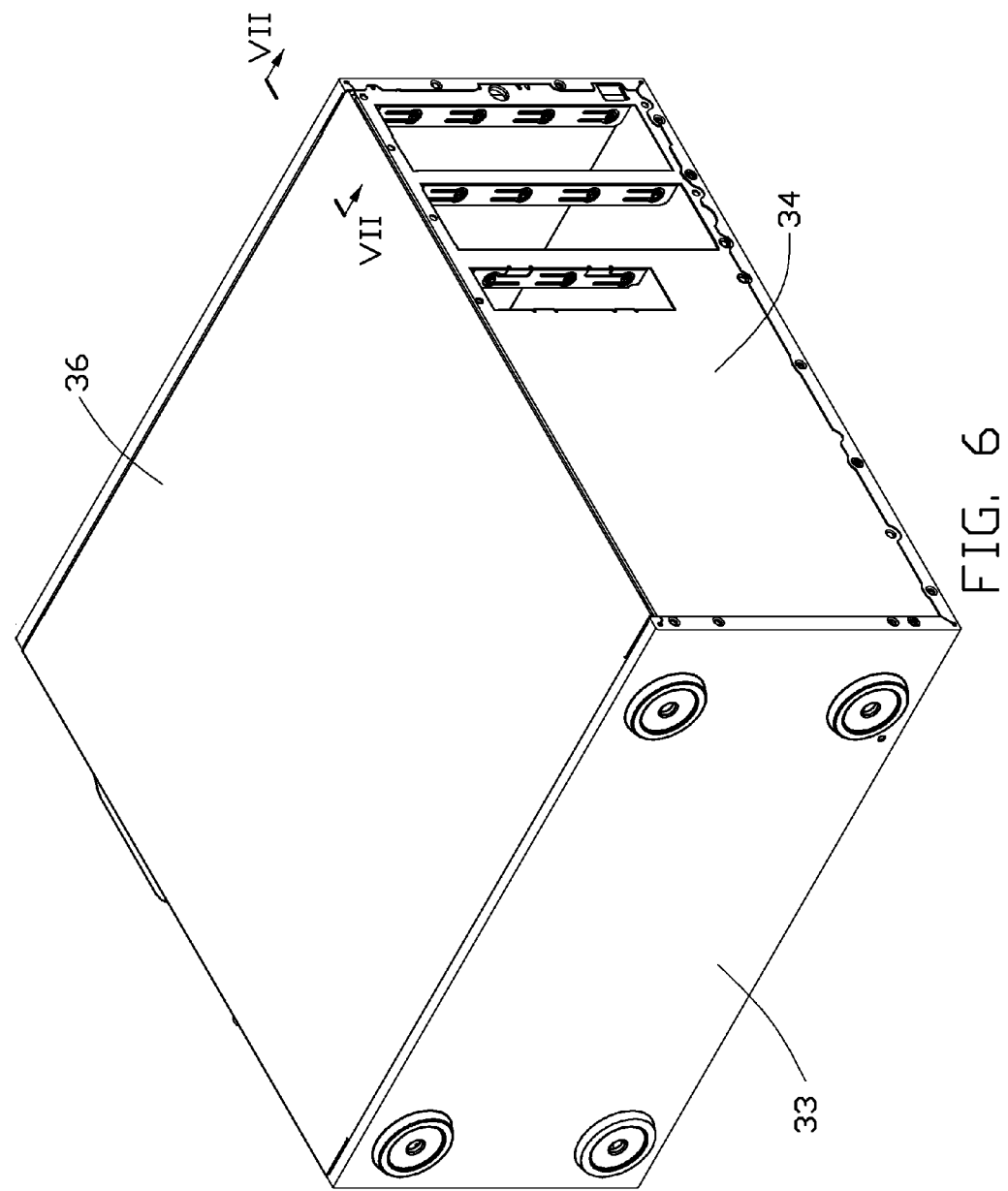
FIG. 6 is an assembled view of the computer enclosure of FIG. 3 with a cover mounted thereon.
Figure 7:
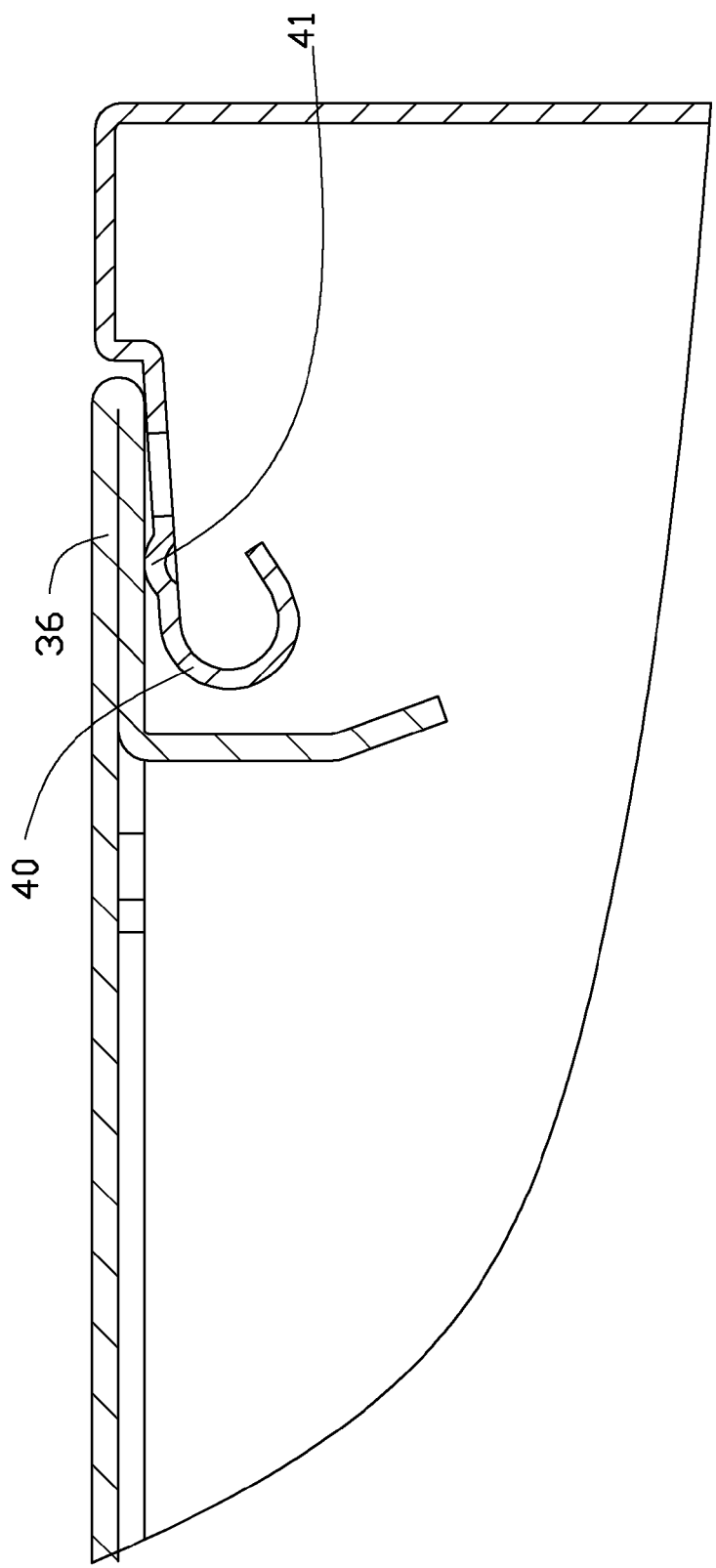
FIG. 7 is a partial cross section taken along line VI-VI of FIG. 6.

Referring to FIGS. 6 and 7, the cover 36 is placed on the computer enclosure 30 to cover the opening. The flanges 351 support the cover 36 thereon. The contact points 41 of the fingers 40 contact the cover 36. The fingers 40 are elastically pressed downwards by the cover 36. Therefore, the cover 36 and the enclosure 30 contact each other to provide EMI shielding. In the embodiment, the fingers 40 are "L"-shaped, providing higher yield strength than conventional longitudinal fingers.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A computer enclosure, comprising:
   a bottom surface;
   a sidewall connected to the bottom surface, a flange extending toward the center of the enclosure from a top edge of the sidewall, a free edge of the flange forming an edge roll by bending the flange downwards, a plurality of elastic fingers formed on the flange, wherein each of plurality of the elastic fingers comprises a fixed end connected to the edge roll, a free end reversely extending from the fixed end toward the sidewall, and a contact point protruding from the free end, the fixed end and the free end being both elastically deformable; and
   a cover covering the flange and elastically pressing the plurality of elastic fingers, the contact point contacting the cover.

2. The computer enclosure of claim 1, wherein the free end of each of the plurality of elastic fingers is set at an angle with respect to a plane defined by the flange.

3. The computer enclosure of claim 1, wherein a portion of each of the plurality of elastic fingers, on which the free end is formed, extends in a direction towards the sidewall.

4. The computer enclosure of claim 3, wherein each of the plurality of elastic fingers is "J"-shape.

5. The computer enclosure of claim 1, wherein the flange defines a slot around each of the plurality of elastic fingers.

6. The computer enclosure of claim 5, wherein the slot surrounds three sides of each of the plurality of elastic fingers.

7. The computer enclosure of claim 5, wherein a width of the slot is 2 mm to 3.5 mm, and a width of each of the plurality of elastic fingers is 3 mm to 4 mm.

8. The computer enclosure of claim 7, wherein a width of the slot is about 2.5 mm, and a width of each of the plurality of elastic fingers is about 3.2 mm.

9. A computer enclosure, comprising:
a sidewall comprising a flange extending toward the center of the enclosure from a top edge of the sidewall a free edge of the flange forming, an edge roll by bending the flange downwards, at least one elastic finger formed on the edge roll; the at least one elastic finger comprises a fixed end connected to the edge roll and a free end reversely extending from the fixed end toward the sidewall, a portion of the at least one elastic finger, on which the free end is formed, extends in a direction towards the sidewall, and the fixed end and the free end are both elastically deformable.

10. The computer enclosure of claim 9, wherein the at least one elastic finger is "J" shape.

11. The computer enclosure of claim 10, wherein the flange defines a slot around the at least one elastic finger.

12. The computer enclosure of claim 11, wherein the free end of the at least one elastic finger is set at an angle with respect to a plane defined by the flange.

13. The computer enclosure of claim 12, wherein a contact point protrudes from the free end of the at least one elastic finger, a cover is located on the flange, the at least one elastic finger is pressed by the cover, and the contact point contacts the cover.

14. The computer enclosure of claim 11, wherein the slot is "U"-shaped, and surrounds three sides of the at least one elastic finger.

* * * * *